(12) United States Patent
Tesson

(10) Patent No.: US 11,201,113 B2
(45) Date of Patent: Dec. 14, 2021

(54) INTEGRATED PASSIVE COUPLER AND METHOD

(71) Applicant: NXP B.V., Eindhoven (NL)

(72) Inventor: Olivier Tesson, Bretteville l'Orgueilleuse (FR)

(73) Assignee: NXP B.V., Eindhoven (NL)

( * ) Notice: Subject to any disclaimer, the term of this patent is extended or adjusted under 35 U.S.C. 154(b) by 24 days.

(21) Appl. No.: 16/523,277

(22) Filed: Jul. 26, 2019

(65) Prior Publication Data
US 2020/0075485 A1    Mar. 5, 2020

(30) Foreign Application Priority Data

Aug. 28, 2018  (EP) .................................... 18306141

(51) Int. Cl.
*H01L 23/522* (2006.01)
*H01L 21/768* (2006.01)
*H01L 23/528* (2006.01)

(52) U.S. Cl.
CPC ........ *H01L 23/5227* (2013.01); *H01L 21/768* (2013.01); *H01L 23/528* (2013.01)

(58) Field of Classification Search
CPC . H01L 23/5277; H01L 21/768; H01L 23/528; H01F 7/06; H04W 88/08
USPC ......... 257/531, 532; 438/171, 190, 210, 238
See application file for complete search history.

(56) References Cited

U.S. PATENT DOCUMENTS

| 6,031,445 | A  | * | 2/2000 | Marty et al. ........ H01F 27/2804 |
|           |    |   |        | 336/200 |
| 7,158,005 | B2 |   | 1/2007 | Pleskach et al. |
| 7,869,784 | B2 |   | 1/2011 | Liu |
| 8,013,689 | B2 |   | 9/2011 | Fan et al. |
| 8,981,852 | B2 |   | 3/2015 | DuPuis |
| 9,356,330 | B1 |   | 5/2016 | Donoghue et al. |
| 2017/0084378 | A1 | | 3/2017 | Leipold et al. |

FOREIGN PATENT DOCUMENTS

| EP | 2863428 A1 | 4/2015 | |
| JP | h02181961 A | * 7/1990 | ............. H01L 27/04 |
| WO | 2004021374 A1 | 3/2004 | |

OTHER PUBLICATIONS

English Computer machine translation of Japanese Patent JP h02181961 by Hachiman Yukio published Jul. 16, 1990 (Year: 1990).*

* cited by examiner

*Primary Examiner* — Thinh T Nguyen

(57) ABSTRACT

An integrated circuit comprising a semiconductor substrate and a passive coupler located on the substrate. The coupler includes a solenoid. The coupler also includes a signal line passing through the solenoid. A method of making an integrated circuit. The method includes providing a semiconductor substrate and forming a passive coupler in a metallization stack on the substrate. Forming the passive coupler in the metallization stack on the substrate includes forming one or more windings of the solenoid using patterned metal features in a plurality of metal layers of the metallization stack. Forming the passive coupler in the metallization stack on the substrate also includes forming a signal line using one or more patterned metal features in one or more metal layers of the metallization stack. The signal line passes through the solenoid.

20 Claims, 4 Drawing Sheets

INTEGRATED PASSIVE COUPLER AND METHOD

CROSS-REFERENCE TO RELATED APPLICATIONS

This application claims the priority under 35 U.S.C. § 119 of European Patent application no. 18306141.5, filed on 28 Aug. 2018, the contents of which are incorporated by reference herein.

BACKGROUND

The present specification relates to an integrated passive coupler and to a method of making an integrated passive coupler.

Couplers are used in many RF circuits to capture a fractional part of a signal, which is to be read by a power detector (telemetry related applications in base stations for example). As the conditions around the application can this can lead to change in impedance value which can be determined via the Voltage Standing Wave Ratio (VSWR). One way to have more robust coupler is to guarantee a level of directivity greater than 10 dB. Directive couplers also typically occupy a large area on an integrated circuit (IC) and it is difficult to account for manufacturing process variations. Indeed, in the core IC, several different voltage levels will have to be measured via, a number of couplers, depending on the output signal level.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided an integrated circuit comprising:
 a semiconductor substrate; and
 a passive coupler located on the substrate,
wherein the coupler comprises:
 a solenoid; and
 a signal line passing through the solenoid.

According to another aspect of the present disclosure, there is provided a method of making an integrated circuit, the method comprising:
 providing a semiconductor substrate; and
 forming a passive coupler in a metallization stack on the substrate, by:
  forming one or more windings of the solenoid using patterned metal features in a plurality of metal layers of the metallization stack; and
  forming a signal line using one or more patterned metal features in one or more metal layers of the metallization stack, wherein the signal line passes through the solenoid.

The provision of a passive coupler located on a substrate of an integrated circuit (IC) can allow the IC to collect for processing a desired part of a signal located on a signal line.

A first end of the solenoid may be isolated. A second end of the solenoid may form a coupled output of the solenoid. The coupled output may be used to collect the desired part of the signal located on the signal line for processing. The isolation of the first end of the solenoid may enhance the directivity of the coupler.

The coupled output of the solenoid maybe coupled to a power detector.

The integrated circuit may include a plurality of switches. Each switch may be coupled between a respective winding of the solenoid and the coupled output of the solenoid. The switches may be implement using one or more transistors.

The plurality of switches may be openable and closable to select a number windings of said solenoid coupled between the isolated first end of the solenoid and the coupled output of the solenoid. Thus may allow the coupling coefficient and/or directivity of the passive coupler to be tuned.

The integrated circuit may include a controller operable to selectively open and close the plurality of switches.

The integrated circuit may include a memory for storing an open/closed state for each switch. This can allow a predetermined configuration of the set of switches to be stored for later use (e.g. to account for manufacturing process variations).

The integrated circuit may include a metallization stack located on a surface of the substrate. The solenoid and the signal line may be formed by patterned metal features located in metal and via layers of the metallization stack. The use of a metallization stack to form the solenoid and the signal line may allow for a particularly compact construction, which need not occupy a large amount of space on the IC.

The solenoid may include a plurality of windings. Each winding may include a first winding section including a patterned metal feature located in a first metal layer of the metallization stack. Each winding may also include a second winding section including a patterned metal feature located in a second metal layer of the metallization stack. Each winding may further include at least one via linking the first winding section to the second winding section. This arrangement may provide a particularly compact construction for the solenoid, minimising insertion losses.

An end of a winding section of one of said windings may form an isolated end of the solenoid.

The signal line may include an elongate patterned metal feature in a metal layer located in between the first metal layer and the second metal layer of the metallization stack. This arrangement may provide a particularly compact construction for the solenoid. For instance, the solenoid and signal line may be constructed in as few as three adjacent metal levels (e.g. M4, M5, M6) in a metallization stack.

The signal line may be an inductor.

According to a further aspect of the present disclosure, there is provided a base station in a cellular telephone network, the base station including an integrated circuit of the kind set out above.

According to another aspect of the present disclosure, there is provided a car RADAR (Radio Detection and Ranging) system including an integrated circuit of the kind set out above.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Figure 1:
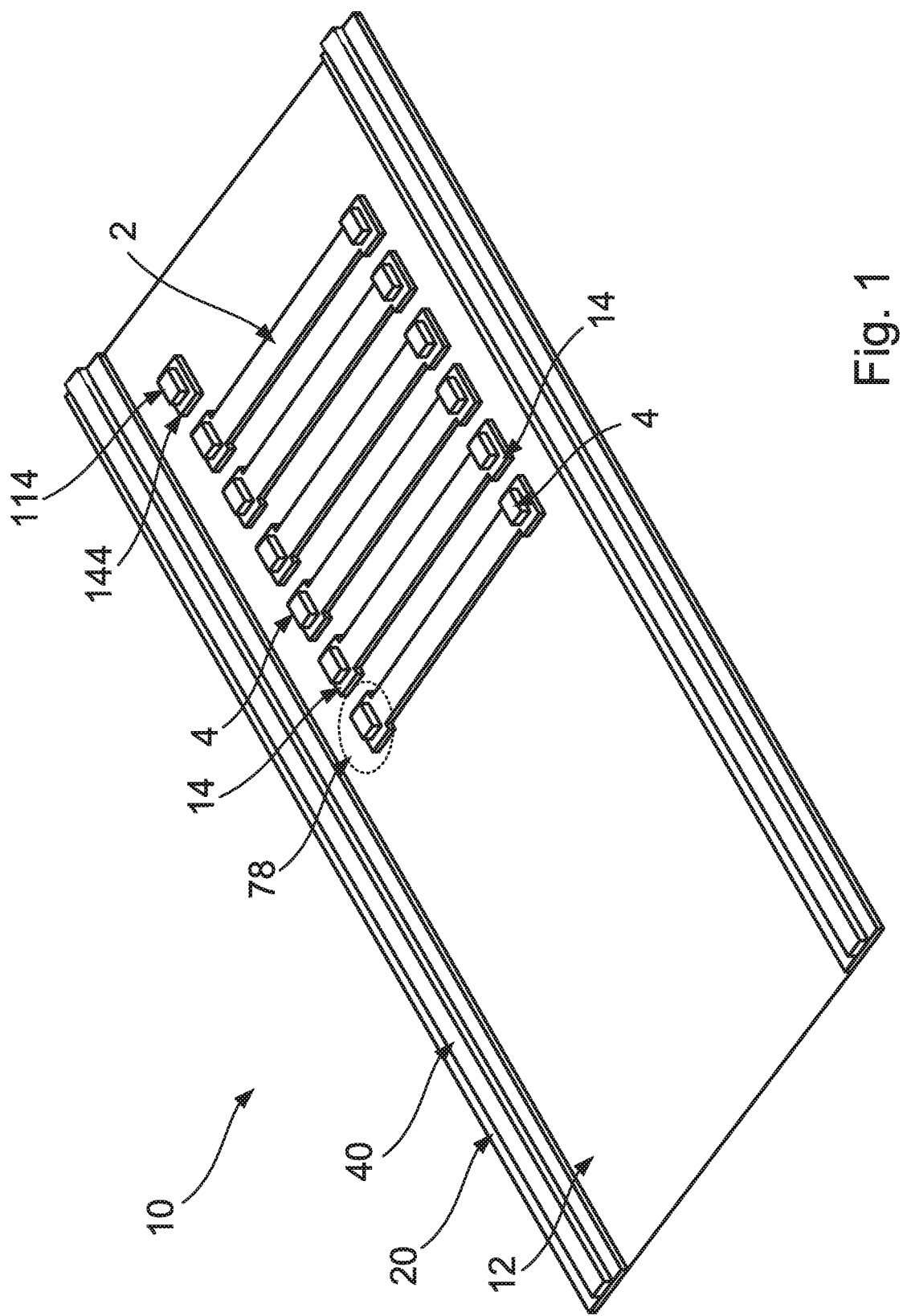
FIGS. 1 to 3 show the various layers of an integrated passive coupler according to an embodiment of the present disclosure.
Figure 2:
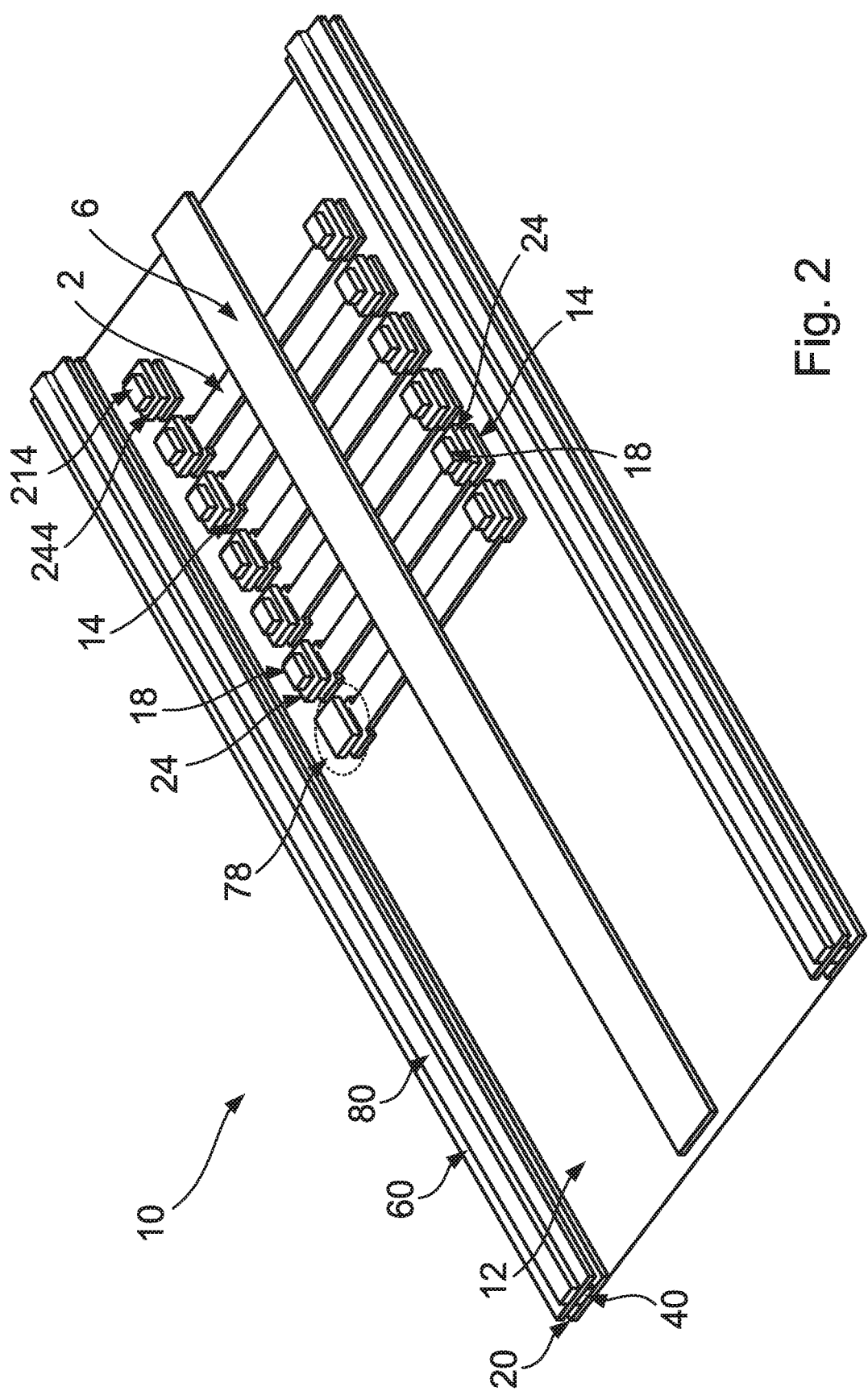
Figure 3:
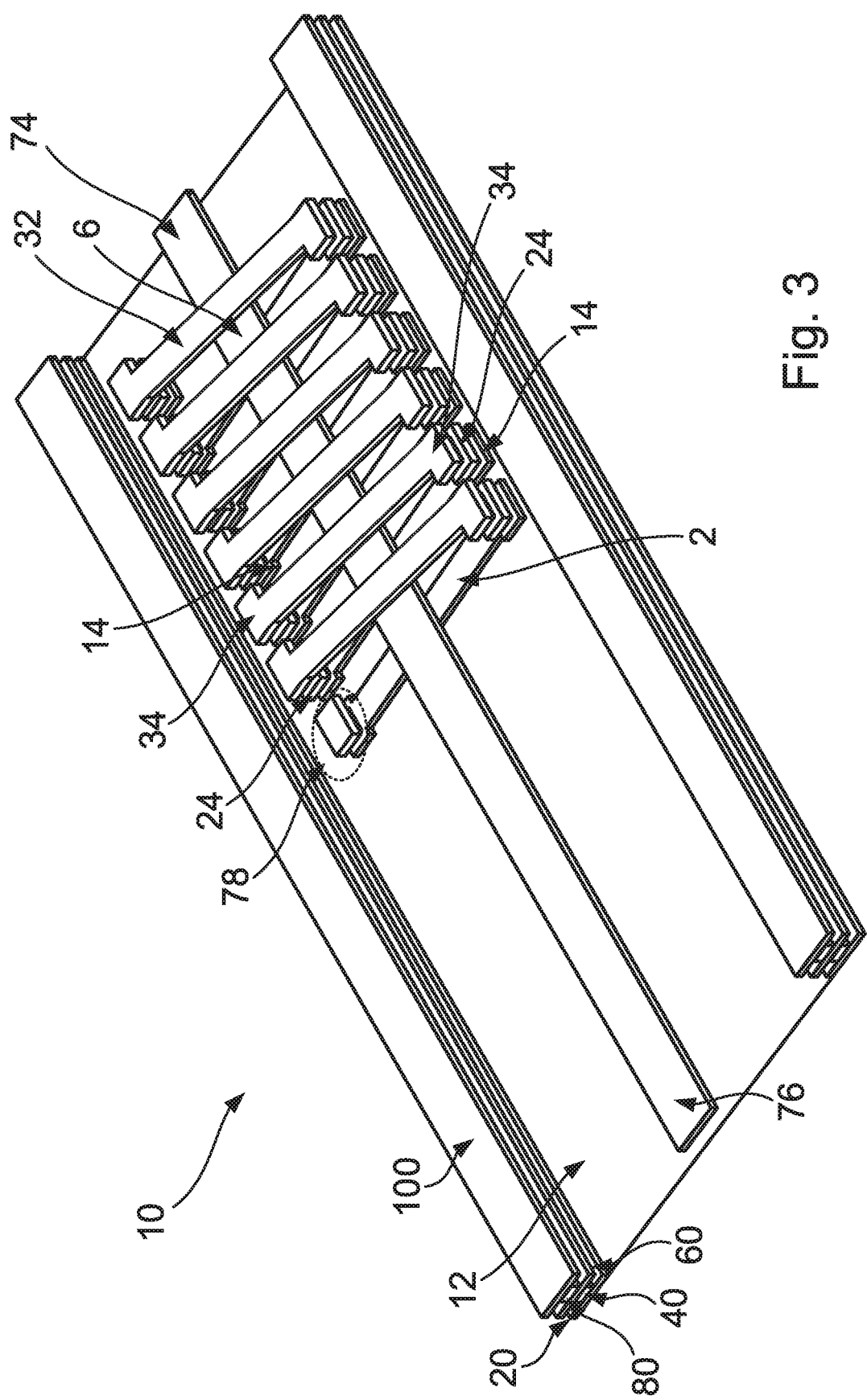

FIGS. 1 to 3 show the various layers of an integrated passive coupler 10 according to an embodiment of the present disclosure. As will be described below, the passive coupler 10 may be integrated on a semiconductor die including a semiconductor substrate. The substrate may, for instance, comprise silicon.

The passive coupler includes a solenoid and a signal line passing through the solenoid. This can allow an integrated circuit including the passive coupler to collect for processing a desired part of a signal located on a signal line. As will be described below in relation to FIG. 4, a plurality of switches may be provided for selecting a number windings of the solenoid to be coupled between a isolated first end of the solenoid and a coupled output of the solenoid. This may allow the coupling coefficient and/or directivity of the coupler to be tuned. According, a degree of flexibility can be provided for allowing the trade off between the coupling coefficient and the directivity of the passive coupler to be optimised.

In the present embodiment, the passive coupler 10 may be formed in a metallization stack formed on a surface 12 of the semiconductor substrate. As is known in the art of semiconductor manufacturing, a metallization stack typically comprises a series of layers built up on the surface of a semiconductor substrate of a integrated circuit (IC). The layers include a plurality of metal layers (which may be denoted by e.g. M1, M2, M3, M4, M5, M6 . . . ), which contain patterned metal features surrounded by a dielectric. The patterned metal layers can be formed by lithographic processes. The layers also include a series of via layers, which are located between the metal layers of the stack. The via layers (which may be denoted by e.g. V1, V2, V3, V4, V5, V6 . . . ) include conductive vias surround by dielectric. The conductive vias extend through the via layers so as to interconnect the patterned metal features located in the metal layers. The metal layers and vias layers may generally be built up in a sequence of the kind: M1, V1, M2, V2, M3, V3, M4, V4, M5, V5, M6, V6 . . . . In this way, it is possible to build up three dimensional conductive structures in the stack.

FIG. 1 shows the lower layers of the metallization stack forming a passive coupler 10 in this embodiment. It will be appreciated that the passive coupler 10 of the kind described herein may be located anywhere in the metallization stack and occupy any number of layers. In the present embodiment, the passive coupler 10 is formed in metal layers M4, M5, M6 and their neighboring via layers. For the purposes of clarity and brevity, any features of the metallization stack (e.g. in underling layers M1 M2, M3 . . . , or in any over lying layers) that are not associated with the passive coupler 10 will not be described here.

The passive coupler 10 in this embodiment includes a plurality of first winding sections 2, which are formed by a series of patterned metal features located in metal layer M4. The first winding sections 2 are generally elongate and extend generally parallel to each other. The ends of each first winding section 2 may be formed into an island 14 that can accommodate the landing of a respective via 4 located in via layer V4.

In the present embodiment, an end of one of the first winding sections 2 located at one end of the solenoid (e.g. an island of that first winding section 2) forms an isolated end 78 of the solenoid. The metal layer M4 may also include a further island 144, for landing a further via 114 from via layer V4. The further island is located at an opposite end of the solenoid to the isolated end 78.

FIG. 2 shows the patterned metal features of the next metal layer (M5) and the via layer V5 in this embodiment.

The patterned metal features in metal layer M5 include a signal line 6. The signal line 6 in this embodiment comprises an elongate metal feature, which extends through the solenoid. In particular, the elongate metal feature forming the signal line may extend along a central axis of the solenoid. Note that the first winding sections 2 in this embodiment do not extend orthogonally with respect to the central axis of the solenoid but instead are angled so as to facilitate the forming of substantially helical solenoid windings. The same is generally true of the second winding sections 32 to be described below, although the second winding sections 32 are generally angled with respect to the central axis in an opposite direction to the first winding sections 2.

The patterned metal features in metal layer M5 also include a number islands 24. The islands may be positioned directly above the islands 14 and the vias 4 described in relation to FIG. 1. The vias 4 may electrically interconnect the islands 14 and the islands 24. The islands 24 also accommodate the landing of a number of respective vias 18 located in V5. The further island 244 and further via 214 may also be provided with a further island 124 and further via 118. Note that while the isolated end 78 of the solenoid may be provided with an island 24, it need not be provided with a via 18.

FIG. 3 shows the patterned metal features of the next metal layer (M6) in this embodiment.

The passive coupler 10 in this embodiment includes a plurality of second winding sections 32, which are formed by a series of patterned metal features located in metal layer M6. Like the first winding sections 2, the second winding sections 32 are generally elongate and extend generally parallel to each other. The ends of each second winding section 32 may be formed into an island 34 that can accommodate the landing of a respective one of the vias 18 located in via layer V5. In this way, the first winding sections 2 and second winding sections 32 may be interconnected through the metallization stack by the vias 4, islands 24 and the vias 18 in order to form the generally helical windings of the solenoid. Note that none of the second winding sections 32 in M6 connect to the isolated end 78 of the solenoid. On the other hand, one of the second winding sections 32 located at the opposite end of the solenoid is interconnected with the further island 144 by the further via 114, further island 244 and further via 214. In this embodiment, the further island 144 forms a coupled output 72 of the solenoid.

FIGS. 1 to 3 also schematically show other features 20, 40, 60, 80, 100 of the metal and via layers M4, V4, M5, V5, M6, respectively. The present embodiment, is based on a CPW (Coplanar Wave Guide) implementation in which the features 20, 40, 60, 80, 100 form lateral rails that comprise the ground rails for the CPW mode. In other examples, for instance in a microstrip implementation, these features 20, 40, 60, 80, 100 may be omitted.

Although the first winding sections 2 and the second winding sections 32 are separated by a single metal layer (M5) in the embodiment shown in FIGS. 1 to 3, it is envisaged that they may be separated by more than one metal layer. This may allow greater flexibility regarding the shape and configuration of the signal line 6. To implement the interconnection of the first winding sections 2 and the second winding sections 32 in such embodiment's, additional vias and islands (similar to the vias 4, 18 and islands 24) may be used. Nevertheless, the embodiment of FIGS. 1 to 3 illustrates the most compact arrangement, which may allow for a minimum of insertion loses.

As mentioned above, a first end of the solenoid is isolated and a second end of the solenoid forms a coupled output 72 of the solenoid. The construction of the solenoid in the metallization stack as described above in relation to FIGS. 1 to 3 can provide a high degree of isolation for the isolated end 78 of the solenoid, which may in turn result in a passive coupler 10 having improved directivity. The signal line 6 may form a signal input 74 and a signal output 76 of the passive coupler 10. For instance, the signal line may carry an RF or mm wave signal. For the purposes of this disclosure "Radio Frequency" (RF) refers to frequencies typically in the range of, but not limited to 10 MHz≤f≤12 GHz. For the purposes of this disclosure "millimeter-wave" refers to frequencies typically in the range of, but not limited to 12 GHz≤f≤300 GHz. For instance, frequencies in the Ku (12-18 GHz), K (18-27 GHz) or Ka (26.5-40) bands may be used.

As noted above, the arrangement of the signal line 6 passing through the solenoid can allow the an integrated circuit including the passive coupler to collect for processing a desired part of a signal located on a signal line. For instance, the coupled output 72 of the solenoid may be coupled to a power detector. The power detector may be integrated in the IC along with the passive coupler 10.

Figure 4:
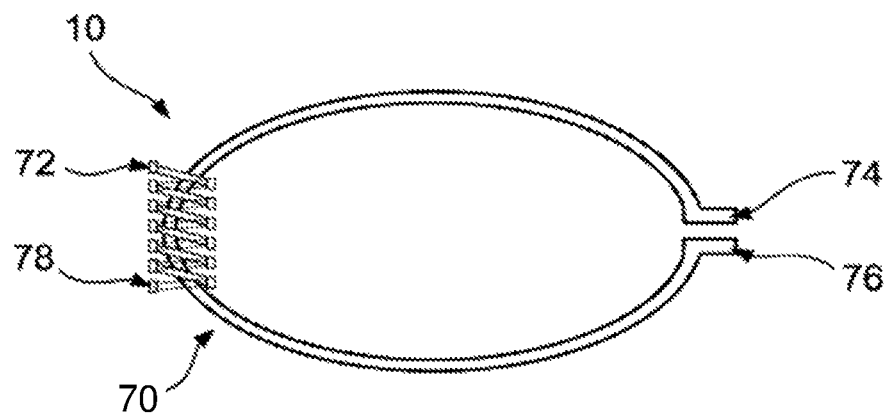
FIG. 4 shows an integrated passive coupler according to another embodiment of the present disclosure.

FIG. 4 shows an integrated passive coupler 10 according to another embodiment of the present disclosure. In this embodiment, the signal line 6 forms a passive component such as an inductor 70. The ends of the inductor 70 form the signal input 74 and signal output 76 of the passive coupler 10. It is envisaged that this embodiment may be implemented in a metallization stack of the kind described above in relation to FIGS. 1 to 3, in which the signal line 6, instead of being substantially linear as shown in that embodiment, is shaped to form the inductor winding(s). Note that the windings of the inductor 70 would pass through the solenoid windings formed in the stack, as described previously.

Figure 5:
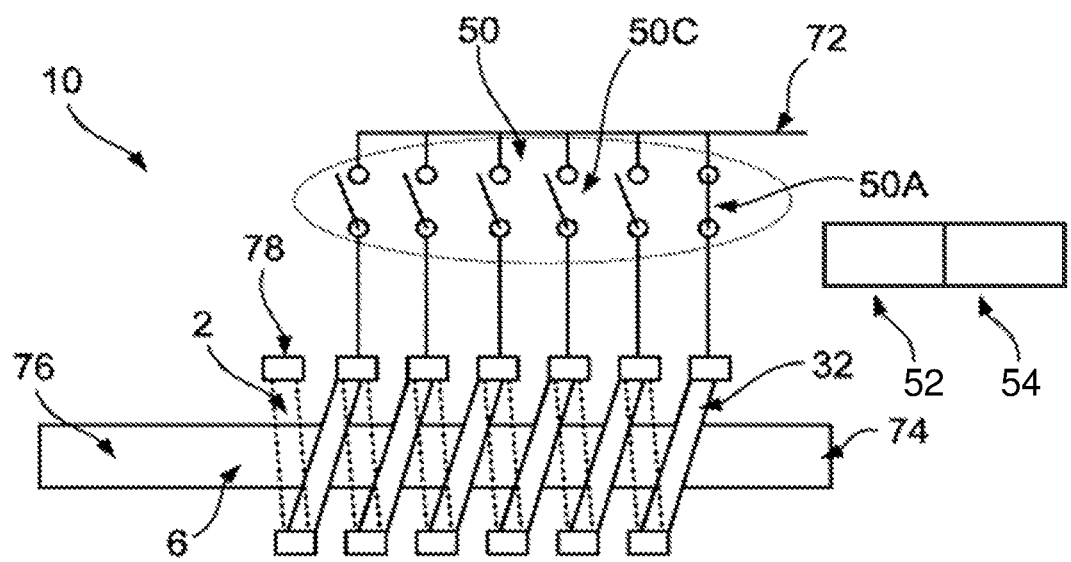
FIG. 5 shows an integrated passive coupler of the kind shown in FIGS. 1 to 3, further including a plurality of switches, according to an embodiment of the present disclosure.

FIG. 5 shows an integrated passive coupler of the kind shown in FIGS. 1 to 3, further including a plurality of switches 50, according to an embodiment of the present disclosure. The switches 50 are each coupled between a respective winding of the solenoid and the coupled output 72. The switches 50 may, for instance, be implement using a plurality of transistors, which may be located in the substrate of the IC. The metallization stack may be provided with patterned metal features for connecting a first side (e.g. source) of each switch 50 to one of the windings of the solenoid. For instance, the first side of each switch may be connected to one of the islands 14, 24 or 34. Typically the connections would be formed such that a switch is connected after each respective winding of the solenoid. For instance, a single solenoid winding may be located between the isolated end 78 of the solenoid and a first of the switches 50, and then a second switch may be connected a distance of two turns away from the isolated end 78, and so on. In the present embodiment, the solenoid has six windings and six switches 50, each switch 50 being connected to one of the windings. It will be appreciated that the solenoid may have any number of windings and switches 50, and that it is not essential that each winding of the solenoid is provided with a switch 50. The other side (e.g. drain) of each switch is connected to the coupled output 72 as noted above.

In this embodiment, the switches 50 allow the number of windings in the solenoid that are used to be tuned, by closing a selected one of the switches 50, while keeping the other switches 50 open. For instance, in FIG. 4, it is shown that switch 50A is closed, while the other switches 50 are all left open. In this case, all (six) of the windings of the solenoid located between the isolated end 78 of the solenoid and the coupled output 72 are enabled. In another example, were the switch 50C to be closed, then only four of the six windings would be enabled. In this way, the number of windings that are enable may be selectively altered, in order to tune the coupling coefficient and/or directivity of the passive coupler 10, The coupling coefficient and/or directivity of the passive coupler 10 may thus be programmable. This can, for instance, allow for manufacturing process variations to be taken into account.

In some embodiments, the integrated circuit may include a controller 52 operable to selectively open and close the plurality of switches 50. The integrated circuit may also include a memory 54 for storing an open/closed state for each switch. This can allow a predetermined state of each switch 50 of the set of switches 50 to be stored for later use. For instance, the stored set of predetermined switch states may be determined and stored as part of a calibration process.

An integrated passive coupler of the kind described herein may be provided in a base station in a cellular telephone network. In another potential application, an integrated passive coupler of the kind described herein may be provided in a car RADAR (Radio Detection and Ranging) system. In a further potential application, an integrated passive coupler of the kind described herein may be provided in front end component of a Wireless Local Area Network (WLAN).

Accordingly, there has been described an integrated circuit comprising a semiconductor substrate and a passive coupler located on the substrate. The coupler includes a solenoid. The coupler also includes a signal line passing through the solenoid. A method of making an integrated circuit. The method includes providing a semiconductor substrate and forming a passive coupler in a metallization stack on the substrate. Forming the passive coupler in the metallization stack on the substrate includes forming one or more windings of the solenoid using patterned metal features in a plurality of metal layers of the metallization stack. Forming the passive coupler in the metallization stack on the substrate also includes forming a signal line using one or more patterned metal features in one or more metal layers of the metallization stack. The signal line passes through the solenoid.

Although particular embodiments of this disclosure have been described, it will be appreciated that many modifications/additions and/or substitutions may be made within the scope of the claims.

The invention claimed is:
1. An integrated circuit comprising:
a semiconductor substrate; and
a passive coupler located on the substrate,
wherein the coupler comprises:
a solenoid, wherein the solenoid comprises a first end coupled to one or more windings, a second end coupled to the one or more windings, and one or more external connections to the one or more windings between the first end and the second end; and a signal line passing through the solenoid.

2. The integrated circuit of claim 1, wherein the first end of the solenoid is isolated and wherein the second end of the solenoid forms a coupled output of the solenoid.

3. The integrated circuit of claim 2, wherein the coupled output of the solenoid is coupled to a power detector.

4. The integrated circuit of claim 2 comprising a plurality of switches, wherein each switch is coupled to the one or more external connections to the one or more windings between a respective winding of the one or more windings of the solenoid and the coupled output of the solenoid.

5. The integrated circuit of claim 4, wherein the plurality of switches are openable and closable to select a number windings of the one or more windings of the solenoid coupled between the isolated first end of the solenoid and the coupled output of the solenoid.

6. The integrated circuit of claim 4, comprising a controller operable to selectively open and close said plurality of switches.

7. The integrated circuit of claim 6 comprising a memory for storing an open/closed state for each switch.

8. The integrated circuit of claim 1, comprising a metallization stack located on a surface of the substrate, wherein the solenoid and the signal line are formed by patterned metal features located in metal and via layers of the metallization stack.

9. The integrated circuit of claim 8, wherein the solenoid comprises a plurality of windings, wherein each winding comprises:

a first winding section comprising a patterned metal feature located in a first metal layer of the metallization stack;

a second winding section comprising a patterned metal feature located in a second metal layer of the metallization stack;

at least one via linking the first winding section to the second winding section.

10. The integrated circuit of claim 9, wherein an end of a winding section of one of said windings forms an isolated end of the solenoid.

11. The integrated circuit of claim 9, wherein the signal line comprises an elongate patterned metal feature in a metal layer located in between the first metal layer and the second metal layer of the metallization stack.

12. The integrated circuit of claim 1, wherein the signal line comprises an inductor.

13. A base station in a cellular telephone network, the base station including an integrated circuit of claim 1.

14. A car RADAR system including an integrated circuit according of claim 1.

15. A method of making an integrated circuit, the method comprising:

providing a semiconductor substrate; and forming a passive coupler in a metallization stack on the substrate, by:

forming one or more windings of a solenoid using patterned metal features in a plurality of metal layers of the metallization stack, wherein the solenoid comprises a first end coupled to the one or more windings, a second end coupled to the one or more windings, and one or more external connections to the one or more windings between the first end and the second end; and forming a signal line using one or more patterned metal features in one or more metal layers of the metallization stack, wherein the signal line passes through the solenoid.

16. The integrated circuit of claim 3 comprising a plurality of switches, wherein each switch is coupled between a respective winding of the solenoid and the coupled output of the solenoid.

17. The integrated circuit of claim 2, comprising a metallization stack located on a surface of the substrate, wherein the solenoid and the signal line are formed by patterned metal features located in metal and via layers of the metallization stack.

18. The integrated circuit of claim 4, wherein each switch of the plurality of switches is coupled to each of the one or more external connections to the one or more windings of the solenoid.

19. The integrated circuit of claim 10, wherein the signal line comprises an elongate patterned metal feature in a metal layer located in between the first metal layer and the second metal layer of the metallization stack.

20. The integrated circuit of claim 9, wherein the signal line comprises an inductor.

\* \* \* \* \*